United States Patent
Hugues et al.

(10) Patent No.: US 6,765,405 B2
(45) Date of Patent: Jul. 20, 2004

(54) PROTECTION CIRCUIT AGAINST VOLTAGE OR CURRENT SPIKES, AND CLOCK CIRCUIT USING A PROTECTION CIRCUIT OF THIS KIND

(75) Inventors: Jean-Francois Hugues, Crolles (FR); Philippe Roche, Meylan (FR); Richard Ferrant, Crolles (FR)

(73) Assignee: STMicroelectronics, S.A., Montrouge (FR)

( * ) Notice: Subject to any disclaimer, the term of this patent is extended or adjusted under 35 U.S.C. 154(b) by 0 days.

(21) Appl. No.: 10/191,089

(22) Filed: Jul. 9, 2002

(65) Prior Publication Data

US 2003/0214772 A1 Nov. 20, 2003

(Under 37 CFR 1.47)

(30) Foreign Application Priority Data

Jul. 11, 2001 (FR) .............................. 01 09190

(51) Int. Cl.[7] .............................................. H03K 17/16
(52) U.S. Cl. .......................................... 326/26; 326/93
(58) Field of Search ......................... 326/26–28, 93–98

(56) References Cited

U.S. PATENT DOCUMENTS

| | | | | |
|---|---|---|---|---|
| 5,614,845 A | * | 3/1997 | Masleid | 326/93 |
| 5,870,332 A | | 2/1999 | Lahey et al. | 365/156 |
| 6,163,172 A | * | 12/2000 | Bazuin et al. | 326/93 |
| 6,249,150 B1 | * | 6/2001 | Matsui | 326/93 |
| 6,498,512 B2 | * | 12/2002 | Simon et al. | 326/93 |
| 6,504,415 B1 | * | 1/2003 | Robinson et al. | 327/291 |

FOREIGN PATENT DOCUMENTS

WO  WO 00/67378  11/2000

* cited by examiner

Primary Examiner—Don Le

(57) ABSTRACT

Disclosed are protection circuitry, and methods of operating the same, for use with clock circuits associated with integrated circuits (ICs). According to one exemplary embodiment, the protection circuitry is operable to generate at least two intermediate clock signals as a function of a received clock signal, and process the at least two intermediate clock signals to (i) cause an output of the protection circuitry to enter a high-impedance state when the at least two intermediate clock signals are different, and (ii) generate a resultant clock signal at the output of the protection circuitry equal to the received clock signal when the at least two intermediate clock signals are identical.

23 Claims, 2 Drawing Sheets

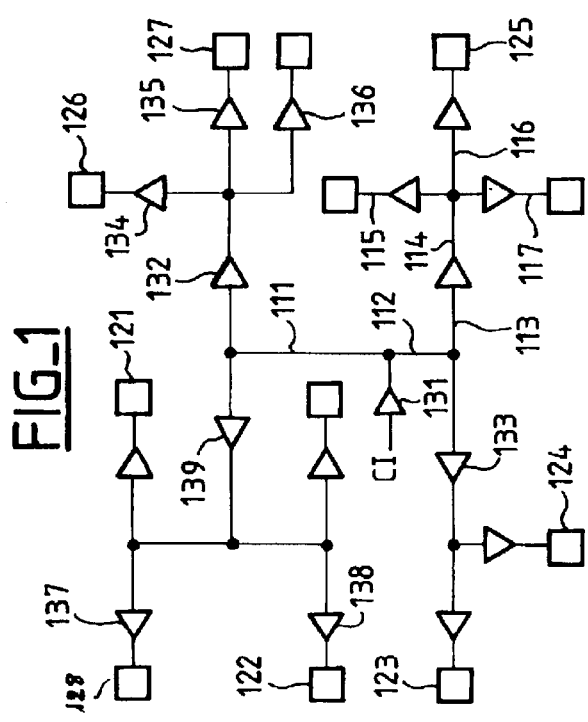

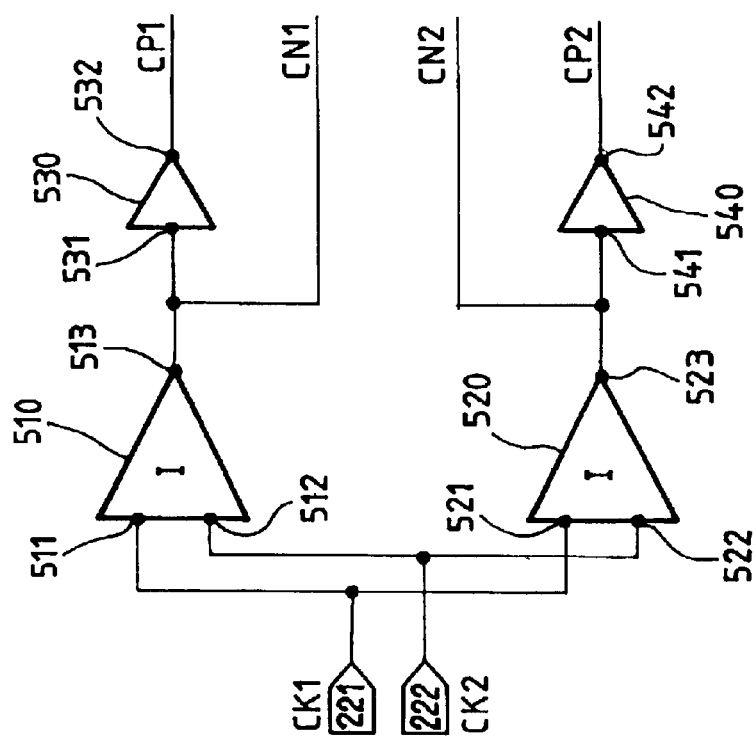
FIG_5
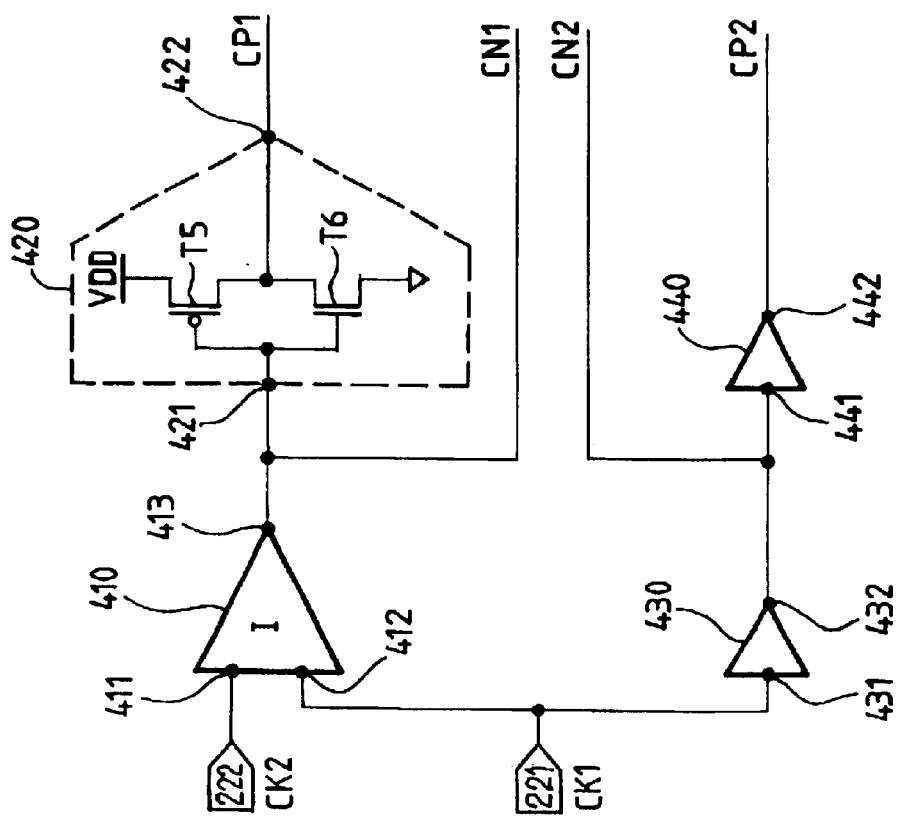
FIG_4

PROTECTION CIRCUIT AGAINST VOLTAGE OR CURRENT SPIKES, AND CLOCK CIRCUIT USING A PROTECTION CIRCUIT OF THIS KIND

PRIORITY CLAIM TO INTERNATIONAL PATENT APPLICATION

This patent application claims priority to French Patent Application Number 01 09190 filed on Jul. 11, 2001.

TECHNICAL FIELD OF THE INVENTION

The invention relates to a clock circuit protected against voltage or current spikes. The invention relates especially to any integrated circuit of which at least one element uses a clock signal for its operation, such as for example (but not exclusively) flip-flop type circuits, latch type circuits or, more generally, logic circuits using a clock signal.

BACKGROUND OF THE INVENTION

The constant and gradual miniaturization of electronic circuits is giving rise to increasingly efficient and ever smaller circuits. This means, however, that the circuits are becoming increasingly sensitive to their environment and especially to logic random events caused by an additional supply of energy from outside the circuit.

A logic random event is a specific change in state or a transitional state (voltage and/or current spike) at the point of an integrated circuit. By definition, a random event is unpredictable or hardly predictable. Logic random events may have different origins.

A logic random event is induced, for example, by the impinging of a charged energy article on a point of an integrated circuit. A random factor of this time is known as a "single event upset" or SEU. This type of random event appears in integrated circuits used for space applications, because of radiation encountered outside the earth's protective atmospheric and magnetospheric layers. This type of random event is also increasingly frequent in integrated circuits for terrestrial applications, especially for the finer technologies such as the 0.25 $\mu$m, 0.18 $\mu$m and 0.12 $\mu$m technologies.

A logic random event may also be induced by localized capacitive coupling between two layers of one and the same integrated circuit. In this case, the term "glitch" is often used.

A random event, whatever its cause, is generally expressed by a voltage and/or current spike on a digital or analog signal at a disturbed point of the circuit (a point of impingement in the case of an SEU, a coupling point in the case of a glitch, etc.).

If C denotes the equivalent capacitance of the circuit downstream from the disturbed point of the circuit, then the variation in voltage $\Delta V$ at the disturbed point considered is written $\Delta V = \Delta Q/C$, $\Delta Q$ being the variation in charge resulting from the impingement or the coupling.

A random event may have consequences of varying importance for the circuit that it disturbs.

For example, for a downstream circuit using only logic signals, if the voltage variation $\Delta V$ is small enough to cause no change in the state of the disturbed logic signal, then the disturbance disappears in a fairly short time without any consequence for the downstream circuit.

If, on the contrary, the voltage variation $\Delta V$ is greater, and especially if it is sufficient to modify the value of the logic signal, then the consequences may be great: a random event may thus cause an inverter to switch over or a SRAM type memory cell to get reprogrammed etc.

The clock circuit of an integrated circuit is generally constituted (FIG. 1) by a tree-like structure comprising different arms 111 to 117 enabling the supply, by a single initial CI, of all the elements 121 to 128 of the integrated circuit. Buffers (most usually inverter amplifiers) 131 to 139 are generally placed along the different arms of the clock circuit in order to control firstly the reductions in the level of the signal due to losses along the arms and, secondly, phase differences generated by the different lengths of arms.

The consequences of a random event on a circuit such as the clock circuit may be great since it may disturb several elements of the circuit simultaneously, depending on the arm of the clock circuit on which the random event appears. Indeed, a random event on an arm of the clock circuit may cause for example a switching or dual switching of the clock signal supplying one or more elements of the integrated circuit. A first consequence thereof is that these elements get desynchronized from the other elements of the integrated circuit. A second consequence is that the downstream circuits could be modified: there could be a change in the state of a memory, a flip-flop circuit etc.

In practice, for a buffer located far upstream from the clock circuit, for example the buffer 131, the capacitive charge at output of this buffer is great because it is constituted by the sum of the capacitive charges of the circuits downstream from the buffer considered. Consequently, a random event appearing at the input of an upstream buffer does not disturb the downstream circuits because the associated variation in voltage $\Delta V$ is low or even very low, the capacitive charge C being high.

On the contrary, for a buffer located far downstream from the clock circuit or even at the input of an element of the integrated circuit, such as for example the buffers 134, 125, the resulting capacitive charge C is low. Therefore, a random event appearing at the input of a downstream buffer is transmitted to the output of this buffer, and it is liable to disturb the working of the downstream circuit or circuits if they are not protected.

It is therefore indispensable to protect the clock circuit of an integrated circuit to prevent any disturbance of the downstream circuits using the clock signal.

SUMMARY OF THE INVENTION

It is an object of the invention to propose a circuit for protection against random events.

It is another object of the invention to propose a clock circuit using a protection circuit of this kind.

It is also an object of the invention to propose a clock circuit producing identical or inverse synchronous clock signals to limit the risk of the cumulative disturbance of several signals simultaneously.

With these goals in view, the invention relates to a protection circuit to receive an initial clock signal and send at least one resultant clock signal to a downstream circuit. According to the invention, the protection circuit comprises:

an input circuit receiving the initial clock signal and producing two intermediate clock signals that are images of the initial clock signal, a recombination circuit to give a first resulting clock signal that is:

the image of the intermediate signals if said intermediate signals are identical, or inactive if the intermediate signals are different from each other.

The term "inactive signal" should be understood here to be a signal that does not disturb a downstream circuit, the output of the recombination circuit that produces it being, in this case, a high-impedance circuit.

The invention also relates to a clock circuit for an integrated circuit comprising a protection circuit such as the one described here above.

Thus, if a random event disturbs the working of the protection circuit according to the invention, then an inactive clock signal is given at output of the protection circuit. The disturbance is not transmitted to the downstream circuit: the operation of the downstream circuit is blocked for a few instants until the disappearance of the disturbance. There is therefore no risk of an undesired operation of the downstream circuit.

Preferably, the protection circuit is connected between a downstream circuit using a clock signal and the end of an arm of the clock circuit giving the clock signal to the downstream circuit. The point of the clock circuit most sensitive to the random events is thus protected.

The input circuit used for the protection circuit according to the invention comprises:

a first buffer comprising an input to which the initial clock signal is applied, and an output to give one of the intermediate clock signals, a second buffer comprising an input connected to the input of the first buffer and an output to give the other one of the intermediate signals.

The input circuit thus separates the initial clock signal into two intermediate clock signals which are identical in normal operation of the circuit. The first buffer and second buffer are preferably distant from each other in the drawing of the circuit. Thus the same random event cannot simultaneously disturb both buffers. Thus, if a random event disturbs the circuit then only one of the intermediate clock signals is liable to be disturbed.

The recombination circuit of the protection circuit that is an object of the invention, for its part, comprises a first complex inverter comprising a first input and a second input to receive respectively both of the intermediate signals, and an output at which the first resultant clock signal is given. As will be seen more clearly hereinafter in a description of an exemplary embodiment, the first complex inverter produces a first resultant clock signal which is:

the inverse of the intermediate clock signals when these signals are identical, inactive (or at high impedance) if they are different.

Thus, a disturbance appearing at one of the intermediate signals is not transmitted to the resultant signal, which is momentarily inactive. The term "inactive signal" must be understood here to mean a signal that does not disturb a downstream circuit. In practice here, when the intermediate clock signals are different, the first complex inverter is off so that its output is at high impedance: the resultant signal is thus kept at its previous value because of the presence of a low capacitance at output of the first inverter, which is inherent in the inverter.

According to a preferred embodiment of the invention, the recombination circuit also comprises a second complex inverter, comprising a first input and a second input to respectively receive both the intermediate signals, and an output at which a second resultant clock signal is given.

The first and second complex inverters are preferably identical, so that the first resultant signal and second resultant signal are identical if the protection circuit is not disturbed by a random event. If, on the contrary, a disturbance appears then it disturbs only one of the two resultant signals and the other one can be used by the downstream circuit.

Preferably again, as a complement to the first complex inverter and the second complex inverter, the recombination circuit comprises a third complex inverter, comprising a first input and a second input to respectively receive the first resultant clock signal and the second resultant clock signal, and an output at which a third resultant clock signal is given.

The third resultant clock signal is:

the inverse of the first resultant signal if the first resultant signal and the second resultant signal are identical, inactive if not.

According to this embodiment, in normal operation, there are thus three signals available at output of the protection circuit, the third signal being complementary to the first two. If, on the contrary, the circuit is disturbed, then at most two of the resultant signals are at high impedance, and the third one therefore remains available.

According to another embodiment, as a complement to the first complex inverter and the second complex inverter, the recombination circuit comprises a first simple inverter comprising an input to receive the first resultant clock signal and an output at which the third resultant clock signal is given, the first simple inverter also comprising:

a fifth P type transistor receiving a power supply voltage at a source, and a sixth N type transistor, a drain of which is connected to a drain of the fifth transistor, and a source of which is connected to the ground of the circuit, a gate of the fifth transistor and a gate of the sixth transistor being connected together to the input of the first simple inverter, the common drain of the fifth transistor and of the sixth transistor being connected to the output of the first simple inverter.

The recombination circuit also preferably comprises a second simple inverter comprising an input to receive the second resultant clock signal and an output at which a fourth resultant clock signal is given.

According to this embodiment, there are four resultant clock signals available at output of the recombination circuit. In normal operation, they are identical in sets of two. If, on the contrary, a random event appears, then only a restricted number of output signals is inactive. The other output signals can be used is by the downstream circuit.

BRIEF DESCRIPTION OF THE DRAWINGS

The invention will be understood more clearly and other features and advantages shall appear from the following description of exemplary embodiments of a clock circuit according to the invention. The description is made with reference to the appended drawings, of which:

FIG. 1 shows a functional diagram of a known clock circuit of an integrated circuit, FIG. 2 shows an embodiment of a protected buffer according to the invention, and FIGS. 3 to 5 show exemplary embodiments of an element of the circuit of FIG. 2.

DETAILED DESCRIPTION OF THE INVENTION

The circuit 200 of FIG. 2 is a buffer protected against the random events according to the invention. It has an input 201 to which the initial clock signal CI is applied, and three outputs at which resultant signals CN1, CN2, CP1 are given.

The circuit 200 comprises an input circuit 210 and a recombination circuit 220. The input circuit produces two intermediate clock signals CK1, CK2 from the initial clock signal CI. The recombination circuit combines the intermediate clock signals CK1, CK2 to obtain the resulting clock signal CN1:

CN1 is the inverse of CK1 if CK1 and CK2 are identical.
CN1 is inactive (high impedance) if CK1 and CK2 are different from each other.

Thus, if the signals CK1, CK2 are not disturbed by a random event, then they are identical and the recombination circuit gives a resultant signal CN1 which is the inverse of CK1. On the contrary, if either of the signals CK1 or CK2 is disturbed by a random event, then the resulting signal CN1 is at high impedance. The signal CN1 will then take a value that is the inverse of that of CN1 as soon as the disturbance has ended.

It must be noted that if the signals CK1 and CK2 were to be disturbed simultaneously, then the disturbance would be transmitted on the signal CN1. However, this signal is almost non-existent inasmuch as it assumes that two random events of equal importance disturb the integrated circuit, simultaneously and at two distinct points of the integrated circuit.

The circuit 220 also gives the signal CN2, which has the same properties as CN1, and the signal CP1, which has the following properties:

CP1 is equal to CK1 if CK1 and CK2 are identical,
CP1 is inactive (at high impedance) if CK1 and CK2 are different from each other.

It must be noted that, in a simplified embodiment, the buffer 200 gives a single signal CN1. A flip-flop type circuit uses, for example, two complementary clock signals CN, CP but other logic circuits use only one or, on the contrary, more than two of them. The number of clock signals produced by the circuit 200 is thus a function of the use made thereof in the downstream circuits.

The input circuit 210 comprises two buffers 211, 212. The buffer 211 has one input to which the signal CI is applied, and one output; the buffer 211 produces the intermediate signal CK1. The buffer 212 comprises one input connected to the input of the buffer 211 and, at an output, it gives the second intermediate signal CK2.

The buffers 211, 212 herein are simple inverters, giving a signal at output that is the inverse of the signal that they receive at their input. The signals CK1, CK2 obtained here are therefore identical if they are not disturbed by a random event.

The inverters may be replaced by any type of buffer that can be used to propagate and, if necessary, amplify and/or phase-shift a received signal, for example in a clock circuit: inverter or non-inverter buffer, buffer comprising several series-connected inverters, buffer memory, flip-flop circuit etc.

The recombination circuit 220 comprises two inputs 221, 222 connected respectively to the output of the buffer 211 and to the output of the buffer 213. At outputs 223 to 225, the recombination circuit produces the resultant clock signals CN1, CN2, CP1.

The recombined signals given by the circuit 200 are independent of each other and their number varies as a function of the requirements of the downstream circuit using them and/or as a function of the degree of overall protection of the integrated circuit to be obtained.

FIG. 3 is a first exemplary embodiment of a circuit 220 that produces three resultant signals CN1, CN2, CP1 from the signals CK1, CK2.

The circuit has three complex inverters 310, 320, 330.

The complex inverter 310 has two inputs 311, 312, to which the signals CK1, CK2 are applied, and one output at which a signal CN1 is provided.

The complex inverter 310 has two P type transistors T1, T2 and two N type transistors T3, T4 that are series-connected. A power supply voltage VDD is applied to a source of the transistor T1 which has a drain connected to a source of the transistor T2. A source of the transistor T3 is connected to the drain of the transistor T4, a source of which is connected to a ground of the circuit.

A gate of the transistor T1 and a gate of the transistor T3 are connected together to the input 311; a gate of the transistor T2 and a gate of the transistor T4 are connected together to the input 312. Finally, a drain of the transistor T2 and a drain of the transistor T3 are connected together to the output 313.

The complex inverter 310 works as follows:
If CK1 and CK2 are identical, then:
if CK1=CK2=0, then T3, T4 are off and T1, T2 are on simultaneously and CN1 is equal to VDD, i.e. it is equal to a logic "1", or
if CK1=CK2=1, then T1, T2 are off and T3, T4 are on simultaneously: CN1 is equal to GND, i.e. it is equal to a logic "0".

Inversely, if CK1 and CK2 are different from each other, then the transistors T1, T2 or T3, T4 are never on simultaneously, and the output 313 remains indeterminate, at high impedance.

The complex inverter 310 in fact produces the resultant clock signal CN1, which is the inverse of CK1 (if CK1 and CK2 are identical) or inactive (if CK1 and CK2 are different from each other).

The complex inverter 320 has two inputs 321, 322 to which the signals CK1, CK2 are applied. The circuit 320 produces a second resultant clock signal CN2 at an output 323. The circuit 320 is made similarly to the complex inverter 310, and it therefore works in similarly: CN2 is the inverse of CK1 if CK1 and CK2 are identical, or CN2 is at high impedance if CK1 and CK2 are different from each other.

It will be noted that, since the inverters 310, 320 are identical, the signals CN1, CN2 are identical in normal operation. If, on the contrary, one of the signals CK1 or CK2 is disturbed, then the signals CN1, CN2 are both at high impedance, in an indeterminate state. It will also be noted that, if a random event disturbs the working of either of the inverters 310 or 320, then only one of the signals CN1 or CN2 is at high impedance, the other signal remaining undisturbed.

The complex inverter 330 has two inputs 331, 332 respectively connected to the output 313 of the inverter 310 to receive the signal CN1, and to the output 323 of the inverter 320 to receive the signal CN2. The circuit 330 produces a third resultant clock signal CP1 at an output 333.

The circuit 330 is made similarly to the complex inverter 310, and therefore works similarly:
CP1 is the inverse of CN1 if CN1 and CN2 are identical
CP1 is inactive (at high impedance) if CN1 and CN2 are different from each other.

It will be noted that, if CN1 or CN2 is disturbed (both cannot be disturbed at the same time), then CP1 is at high impedance.

FIG. 4 is a second exemplary embodiment of a circuit 220 according to the invention, which produces four resultant signals CN1, CN2, CP1, CP2 from the signals CK1, CK2. The circuit has a complex inverter 410, and three simple inverters 420, 430, 440.

The complex inverter 410 has two inputs 411, 412, to which the signals CK1, CK2 are applied and an output 413 at which the signal CN1 is given. The circuit 410 is made similarly to the complex inverter 310, and therefore works similarly: CN1 is the inverse of CK1 if CK1 and CK2 are identical, or CN1 is at high impedance if CK1 and CK2 are different from each other.

The simple inverter 420 has an input 421 connected to the output 413 of the inverter 410, and an output 422 at which the signal CP1 is produced. Here, the signal CP1 has the following value:

CP1 is the inverse of CN1 if CN1 is active,

CP1 is inactive (at high impedance) if CN1 is inactive.

The simple inverter 430 comprises a connected input 431 to which the signal CK1 is applied and an output 432 at which the signal CN2 is produced. The signal CN2 has the following value:

CN2 is the inverse of CK1 if CK1 is active,

CN2 is inactive (at high impedance) if CK1 is inactive.

The simple inverter 440 has an input 441 connected to the output 432 of the inverter 410, and an output 432 at which the signal CP2 is produced. The signal CP2 has the following value:

CP2 is the inverse of CN2 if CN2 is active,

CP2 is inactive (at high impedance) if CN2 is inactive.

Thus, in this example:

if the signals CK1, CK2 and the elements 410, 420, 430, 440 are not disturbed, then CN1=CN2 and these two signals are the inverse of CK1=CK2, and CP1=CP2=CK1.

if the signal CK1 or the signal CK2 is disturbed by a random event, then the signals CN2, CP2 are disturbed but the signals CN1, CP1 are at high impedance; this makes it possible to turn off the downstream circuits.

FIG. 5 shows a third exemplary embodiment of a circuit 220, which produces four resultant signals CN1, CN2, CP1, CP2 from the signals CK1, CK2. The circuit has two complex inverters 510, 520 and two simple inverters 530, 540.

The complex inverter 510 has two inputs 511, 512 to which the signals CK1, CK2 are applied and an output 513 at which the signal CN1 is given. The circuit 510 is made similarly to the complex inverter 310, and therefore works similarly: CN1 is the inverse of CK1 (if CK1 and CK2 are identical) or CN1 is at high impedance (if CK1 and CK2 are different from each other).

The complex inverter 520 has two inputs 521, 522 to which the signals CK1, CK2 are applied and one output 523 at which the signal CN2 is given. The inverter 520 is made similarly to the complex inverter 510, and therefore works similarly: CN2 is the inverse of CK1 (if CK1 and CK2 are identical) or is at high impedance (if CK1 and CK2 are different from each other).

The simple inverter 530 has an input 531 connected to the output 513 of the inverter 510, and an output 532 at which the signal CP1 is produced. The signal CP1 has the following value:

CP1 is the inverse of CN1 if CN1 is active,

CP1 is inactive (at high impedance) if CN1 is inactive.

The simple inverter 540 comprises an input 541 connected to the output 523 of the inverter 520, and an output 542 at which the signal CP2 is produced. The signal CP2 has the following value:

CP2 is the inverse of CN2 if CN2 is active,

CP2 is inactive (at high impedance) if CN2 is inactive.

As can be seen in the examples of FIGS. 2 to 5, a buffer 200 protected according to the invention has the following characteristics: if a random event appears at a point of the circuit 200, or if one of the intermediate clock signals CK1, CK2 or the initial clock signal CI is disturbed by a random event, then at least one of the resultant clock signals CN1, CN2, CP1, CP2 is at high impedance. The operation of the downstream circuits can therefore be turned off in a localized way during the disturbance.

Thus, a disturbance appearing at a point of the circuit 200 or else upstream from this circuit is never transmitted to the downstream circuits which are thus protected by the circuit 200.

What is claimed is:

1. A protection circuit to receive an initial clock signal and send at least one resultant clock signal to a downstream circuit, the protection circuit comprising:

an input circuit receiving the initial clock signal and producing two intermediate clock signals that are images of the initial clock signal, and a recombination circuit to one of (i) give a first resulting clock signal that is the image of the intermediate signals if said intermediate signals are identical, and (ii) inactive if the intermediate signals are different from each other.

2. A protection circuit according to claim 1, wherein the input circuit comprises:

a first buffer comprising an input to which the initial clock signal is applied, and an output to give one of the intermediate clock signals, and a second buffer comprising an input connected to the input of the first buffer and an output to give the other one of the intermediate signals.

3. A protection circuit according to claim 1, wherein the recombination circuit comprises a first complex inverter comprising a first input and a second input to receive respectively both of the intermediate signals, and an output at which the first resultant clock signal is given, the first complex inverter also comprising:

a first P type transistor, receiving a power supply voltage at a source, a second P type transistor, one source of which is connected to a drain of the first transistor, a third N type transistor, one drain of which is connected to a drain of the second transistor, a fourth N type transistor, one drain of which is connected to a source of the third transistor and a source of which is connected to a ground of the circuit, and a gate of the premier first transistor and a gate of the third transistor being connected together to one of the inputs of the first complex inverter, a gate of the second transistor, a gate of the fourth transistor being connected together to the other of the inputs of the first complex inverter, and common drain of the second transistor and of the third transistor being connected to the output of the first complex inverter.

4. A protection circuit according to claim 3, wherein the recombination circuit also comprises a second complex inverter, comprising a first input and a second input to respectively receive both the intermediate signals, and an output at which a second resultant clock signal is given.

5. A protection circuit according to claim 4, wherein the recombination circuit also comprises a third complex inverter, comprising a first input and a second input to respectively receive the first resultant clock signal and the second resultant clock signal, and an output at which a third resultant clock signal is given.

6. A protection circuit according to claim 4, wherein the recombination circuit also comprises a first simple inverter, comprising an input to receive the first resultant clock signal, and an output at which the third resultant clock signal is given, the first simple inverter also comprising:
- a fifth P type transistor receiving a power supply voltage at a source, and
- a sixth N type transistor, a drain of which is connected to a drain of the fifth transistor, and a source of which is connected to the ground of the circuit, and
- a gate of the fifth transistor and a gate of the sixth transistor being connected together to the input of the first simple inverter, the common drain of the fifth transistor and of the sixth transistor being connected to the output of the first simple inverter.

7. A protection circuit according to claim 6, wherein the recombination circuit also comprises a second simple inverter, comprising an input to receive the second resultant clock signal, and an output at which a fourth resultant clock signal is given.

8. A protection circuit according to claim 3, also comprising the first simple inverter comprising an input to which one of the intermediate signals is applied, the first simple inverter comprising an output at which the second resultant clock signal is given.

9. A protection circuit according to claim 8, also comprising the second simple inverter comprising an input connected to the output of the first complex inverter and an output at which the third resultant output signal is produced.

10. A protection circuit according to claim 8, also comprising a third simple inverter comprising an input connected to the output of the first simple inverter and an output at which the fourth resultant clock signal is produced.

11. A clock circuit according to claim 10, wherein the protection circuit is connected between a circuit using a clock signal and a part of an arm of the clock circuit giving said clock signal.

12. A protection circuit according to claim 9 further comprising a third simple inverter comprising an input connected to the output of the first simple inverter and an output at which the fourth resultant clock signal is produced.

13. A clock circuit for association with an integrated circuit (IC) comprising protection circuitry operable to (i) generate at least two intermediate clock signals as a function of a received clock signal, and (ii) process said at least two intermediate clock signals to cause an output of said protection circuitry to enter a high-impedance state when said at least two intermediate clock signals are different.

14. The clock circuit as set forth in claim 13 wherein said protection circuitry is further operable to generate a resultant clock signal at said output of said protection circuitry equal to said received clock signal when said at least two intermediate clock signals are identical.

15. The clock circuit as set forth in claim 13 wherein said protection circuitry comprises at least two complex inverters, each one of said at least two complex inverters comprising at least two inputs to receive respectively said at least two intermediate clock signals and an output to give a corresponding resultant clock signal.

16. The clock circuit as set forth in claim 15 wherein said protection circuitry comprises at least two simple inverters, each one of said at least two simple inverters comprising an input to receive one of said corresponding resultant clock signals and an output to give another corresponding resultant clock signal.

17. An integrated circuit (IC) comprising:
a clock circuit operable to generate a clock signal; and
protection circuitry operable to (i) generate at least two intermediate clock signals as a function of said clock signal, and (ii) process said at least two intermediate clock signals to:
(a) cause an output of said protection circuitry to enter a high-impedance state when said at least two intermediate clock signals are different; and
(b) generate a resultant clock signal at said output of said protection circuitry equal to said received clock signal when said at least two intermediate clock signals are identical.

18. The IC set forth in claim 17 wherein said protection circuitry comprises at least two complex inverters, each one of said at least two complex inverters comprising at least two inputs to receive respectively said at least two intermediate clock signals and an output to give a corresponding resultant clock signal.

19. The IC as set forth in claim 18 wherein said protection circuitry comprises at least two simple inverters, each one of said at least two simple inverters comprising an input to receive one of said corresponding resultant clock signals and an output to give another corresponding resultant clock signal.

20. The IC as set worth in claim 17 there comprising circuitry associated with said protection circuitry and operable to use said resultant clock signal.

21. A method of operating clock circuitry for use in an integrated circuit (IC), said method comprising the steps of:
generating a clock signal;
generating at least two intermediate clock signals as a function of said clock signal;
causing an output of said clock circuitry to enter a high-impedance state when said at least two intermediate clock signals are different; and
generating a resultant clock signal equal to said received clock signal when said at least two intermediate clock signals are identical.

22. The method of operating clock circuitry for use in said IC as set forth in claim 21 wherein said clock circuitry comprises at least two complex inverters, each one of said at least two complex inverters comprising at least two inputs to receive respectively said at least two intermediate clock signals and an output to give a corresponding resultant clock signal.

23. The method of operating clock circuitry for use in said IC as set forth in claim 22 wherein said clock circuitry comprises at least two simple inverters, each one of said at least two simple inverters comprising an input to receive one of said corresponding resultant clock signals and an output to give another corresponding resultant clock signal.

* * * * *